(12) United States Patent
Matsuo et al.

(10) Patent No.: US 10,090,158 B2
(45) Date of Patent: Oct. 2, 2018

(54) ETCHING METHOD, METHOD OF MANUFACTURING SEMICONDUCTOR CHIP, AND METHOD OF MANUFACTURING ARTICLE

(71) Applicant: KABUSHIKI KAISHA TOSHIBA, Minato-ku (JP)

(72) Inventors: Keiichiro Matsuo, Yokohama (JP); Yusaku Asano, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/658,561

(22) Filed: Jul. 25, 2017

(65) Prior Publication Data
US 2018/0033634 A1 Feb. 1, 2018

(30) Foreign Application Priority Data
Jul. 28, 2016 (JP) .................. 2016-148325

(51) Int. Cl.
| | |
|---|---|
| *H01L 21/301* | (2006.01) |
| *H01L 21/46* | (2006.01) |
| *H01L 21/78* | (2006.01) |
| *H01L 21/306* | (2006.01) |
| *B01J 23/42* | (2006.01) |
| *B01J 23/46* | (2006.01) |
| *B01J 23/50* | (2006.01) |
| *B01J 23/52* | (2006.01) |

(Continued)

(52) U.S. Cl.
CPC ........ *H01L 21/30604* (2013.01); *B01J 23/42* (2013.01); *B01J 23/464* (2013.01); *B01J 23/50* (2013.01); *B01J 23/52* (2013.01); *C09K 13/00* (2013.01); *H01L 21/308* (2013.01); *H01L 21/78* (2013.01)

(58) Field of Classification Search
CPC .. H01L 21/30604; H01L 21/308; B01J 23/42; B01J 23/462
USPC ........................................ 438/462
See application file for complete search history.

(56) References Cited

U.S. PATENT DOCUMENTS

| | | |
|---|---|---|
| 2008/0090074 A1 | 4/2008 | Matsumura et al. |
| 2011/0266521 A1 | 11/2011 | Ferrari et al. |

(Continued)

FOREIGN PATENT DOCUMENTS

| | | |
|---|---|---|
| JP | 2011-101009 | 5/2011 |
| JP | 2013-527103 | 6/2013 |

(Continued)

*Primary Examiner* — David S Blum
(74) *Attorney, Agent, or Firm* — Oblon, McClelland, Maier & Neustadt, L.L.P.

(57) ABSTRACT

An etching method according to an embodiment includes forming a catalyst layer made of a first noble metal or the combination of the second noble metal and the metal other than noble metals on a surface made of a semiconductor, the catalyst layer including a first portion and a second portion, the first portion covering at least a part of the surface, the second portion being located on the first portion, having an apparent density lower than that of the first portion, and being thicker than the first portion; and supplying an etchant to the catalyst layer to cause an etching of the surface with an assist from the catalyst layer as a catalyst.

18 Claims, 11 Drawing Sheets

(51) Int. Cl.
    *C09K 13/00*     (2006.01)
    *H01L 21/308*    (2006.01)

(56) References Cited

U.S. PATENT DOCUMENTS

| | | | |
|---|---|---|---|
| 2012/0088372 A1* | 4/2012 | Chien | ................. H01L 21/0203 |
| | | | 438/753 |
| 2015/0130028 A1 | 5/2015 | Asano et al. | |
| 2016/0079078 A1 | 3/2016 | Asano | |

FOREIGN PATENT DOCUMENTS

| | | |
|---|---|---|
| JP | 2015-119170 | 6/2015 |
| JP | 2016-058647 | 4/2016 |
| TW | 201528363 A | 7/2015 |
| TW | 201614104 A | 4/2016 |

\* cited by examiner

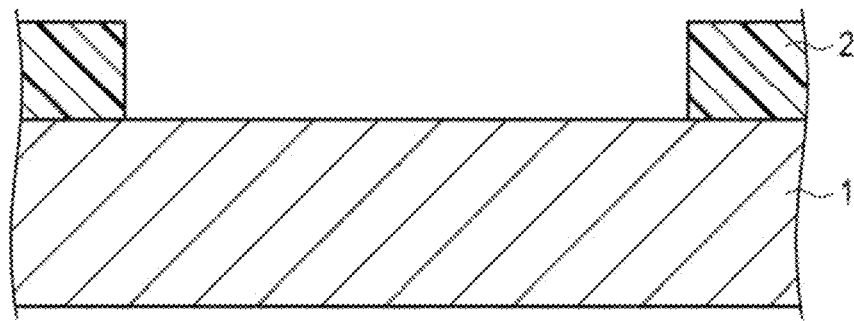
F I G. 1
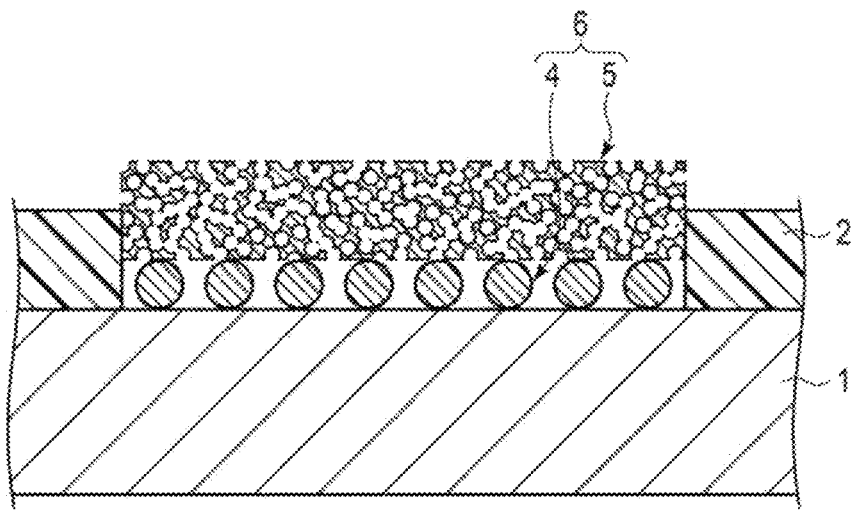
F I G. 2

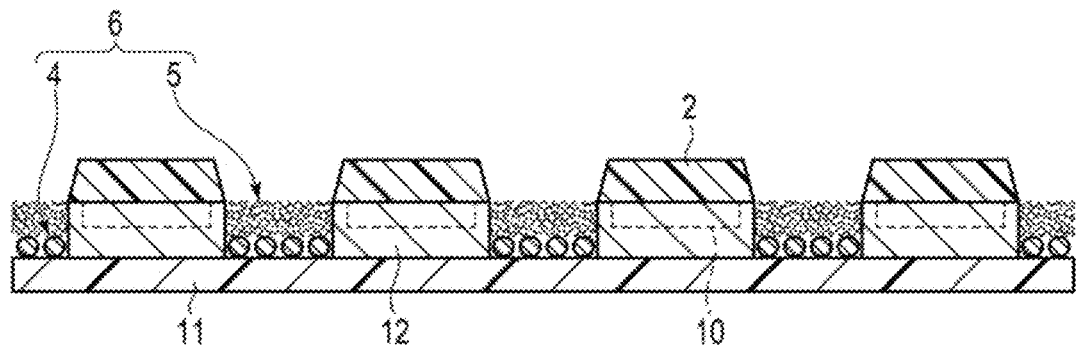
F I G. 11
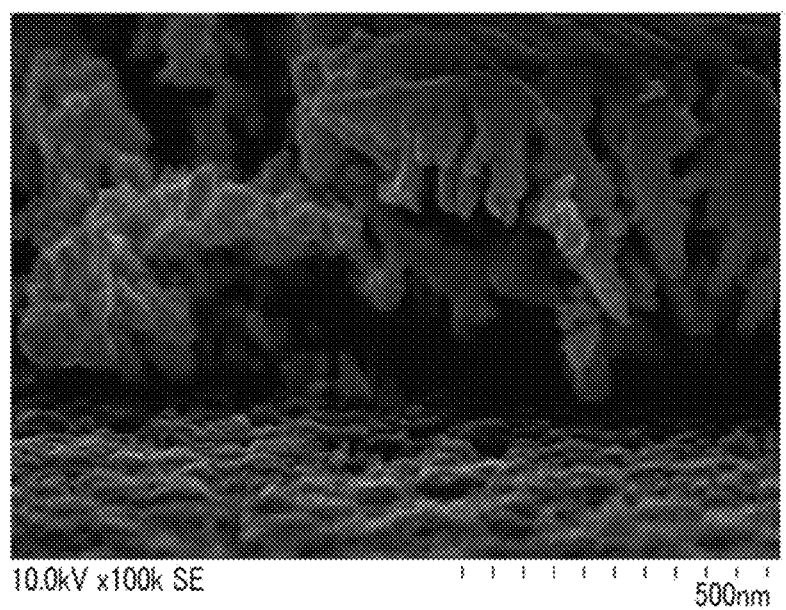
F I G. 12

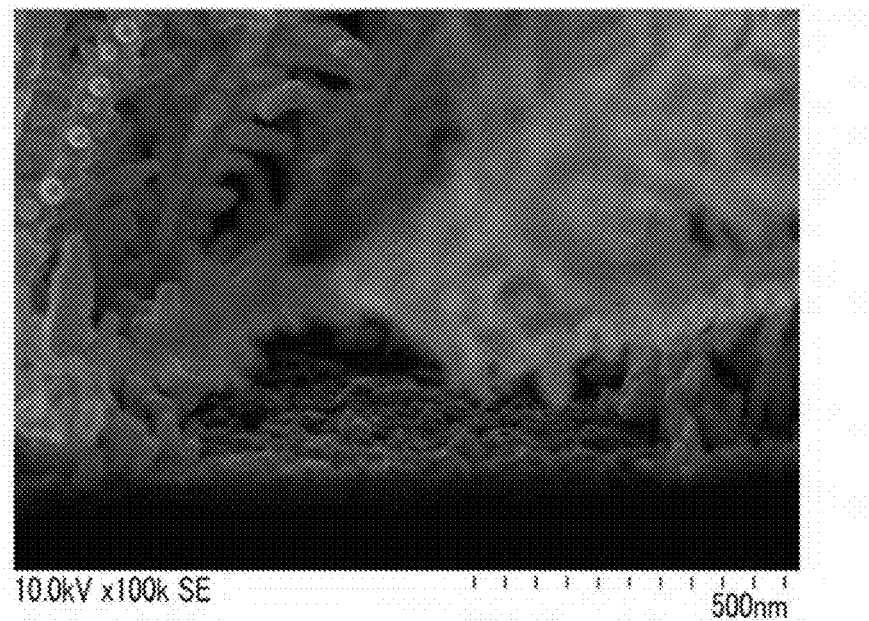
F I G. 15
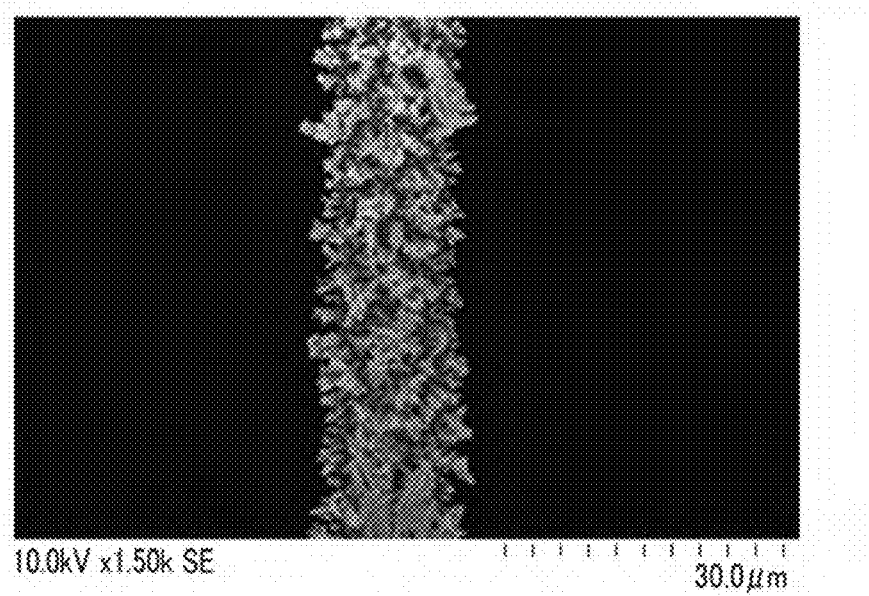
F I G. 16

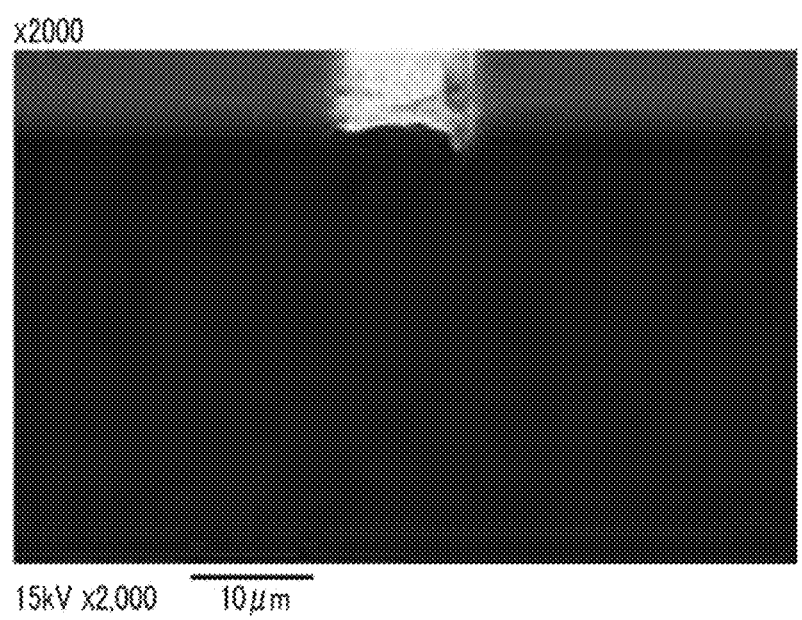
F I G. 21

US 10,090,158 B2

ETCHING METHOD, METHOD OF MANUFACTURING SEMICONDUCTOR CHIP, AND METHOD OF MANUFACTURING ARTICLE

CROSS-REFERENCE TO RELATED APPLICATION

This application is based upon and claims the benefit of priority from Japanese Patent Application No. 2016-148325, filed Jul. 28, 2016, the entire contents of which are incorporated herein by reference.

FIELD

Embodiments described herein relate generally to an etching method, a method of manufacturing a semiconductor chip, and a method of manufacturing an article.

BACKGROUND

Metal-assisted chemical etching (MacEtch) is a method of etching a semiconductor surface using a noble metal as a catalyst. According to the MacEtch, for example, a hole with a high aspect ratio can be formed in a semiconductor substrate.

BRIEF DESCRIPTION OF THE DRAWINGS

FIG. 1 is a sectional view schematically showing a structure to be etched in an etching method according to an embodiment;

FIG. 2 is a sectional view schematically showing a catalyst layer formation step in the etching method according to the embodiment;

FIG. 11 is a sectional view taken along a line XI-XI of the semiconductor wafer shown in FIG. 10;

FIG. 12 is a micrograph showing a section of a structure on which a dendrite is formed;

FIG. 15 is a micrograph showing a section of a structure on which a dendrite is formed;

FIG. 16 is a micrograph showing a top surface of the structure on which a dendrite is formed;

FIG. 21 is a micrograph showing a section of a structure obtained by etching the structure on which a catalyst layer formed of noble metal particles is formed.

DETAILED DESCRIPTION

Figure 3:
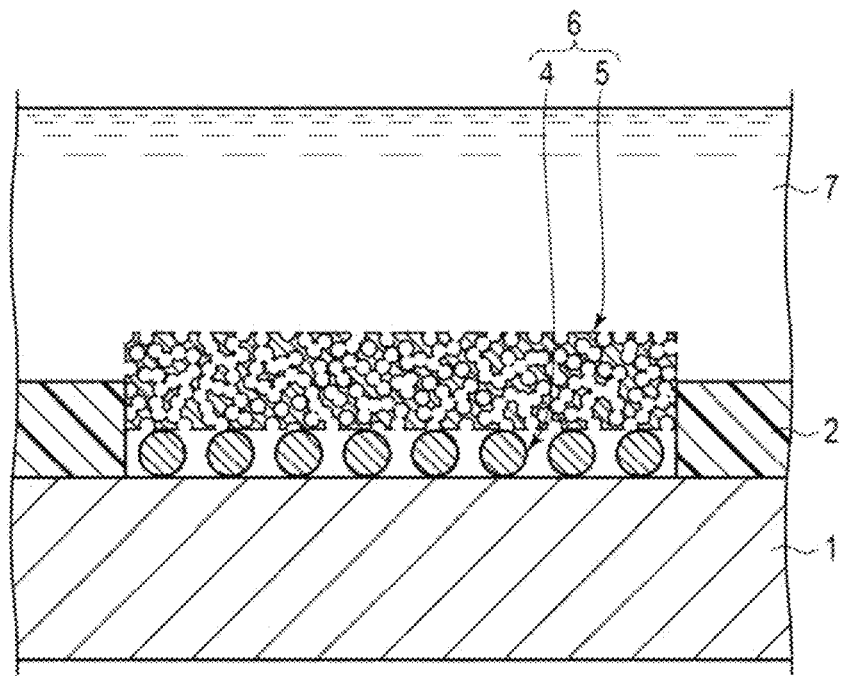
FIG. 3 is a sectional view schematically showing a state at the start of an etching step in the etching method according to the embodiment.

An etching method according to the first embodiment comprises forming a catalyst layer made of a first noble metal or a combination of a second noble metal and a metal other than noble metals on a surface made of a semiconductor, the catalyst layer including a first portion and a second portion, the first portion covering at least a part of the surface, the second portion being located on the first portion, having an apparent density lower than that of the first portion, and being thicker than the first portion; and supplying an etchant to the catalyst layer to cause an etching of the surface with an assist from the catalyst layer as a catalyst.

A method of manufacturing a semiconductor chip according to the second embodiment comprises etching a semiconductor wafer by the etching method according to the first embodiment to singulate the semiconductor wafer into semiconductor chips, the surface being a surface of the semiconductor wafer.

A method of manufacturing an article according to the third embodiment comprises etching the surface by the etching method according to the first embodiment.

Embodiments will be explained in detail below with reference to the accompanying drawings. Note that the same reference numerals denote constituent elements which achieve the same or similar functions throughout all the drawings, and a repetitive explanation will be omitted.

First, an etching method according to an embodiment will be described with reference to FIGS. 1 to 4.

In this method, a structure 1 as shown in FIG. 1 is prepared first.

At least a part of the surface of the structure 1 is made of a semiconductor. The semiconductor is, for example, selected from semiconductors made of Si, Ge, compounds of group-III and group-V elements such as GaAs and GaN, and SiC. Note that a term "group" herein used is "a group" in the short-form periodic table.

The structure 1 is, for example, a semiconductor wafer. The semiconductor wafer can be doped with impurities, or a semiconductor element such as a transistor or diode can be formed on the semiconductor wafer. Also, the principal surface of the semiconductor wafer can be parallel to any crystal plane of the semiconductor.

Then, a mask layer 2 is formed on the surface made of a semiconductor of the structure 1.

The mask layer 2 is a layer for forming a metal pattern containing a noble metal as a catalyst layer on the surface of the structure 1. The mask layer 2 has an opening. The width of the opening is preferably within a range of 0.1 μm to 15

μm and more preferably within a range of 5 μm to 10 μm. When forming a dendrite or flakes, which will be described later, it is difficult to sufficiently coat the surface made of a semiconductor with a catalyst layer at the position of the opening if the opening is too wide. When the opening is too narrow, it is difficult for an etchant to reach the surface made of a semiconductor.

Any material can be used as the material of the mask layer 2, provided that the material can suppress the deposition of a noble metal, etc. (to be described later) on a region of the surface of the structure 1 which is covered with the mask layer 2. Examples of the material include organic materials such as polyimide, a fluorine resin, a phenolic resin, an acrylic resin and a novolak resin, and inorganic materials such as silicon oxide and silicon nitride.

The mask layer 2 can be formed by, for example, the existing semiconductor processes. The mask layer 2 made of an organic material can be formed by, for example, photolithography. The mask layer 2 made of an inorganic material can be formed by, for example, the deposition of an inorganic material layer by vapor phase deposition, formation of a mask by photolithography and patterning of the inorganic material layer by etching. Alternatively, the mask layer 2 made of an inorganic material can be formed by oxidation or nitriding of the surface region of the structure 1, formation of a mask by photolithography and patterning of the oxide or nitride layer by etching. The mask layer 2 can be omitted.

Subsequently, a catalyst layer 6 is formed on the surface made of a semiconductor of the structure 1 as shown in FIG. 2. The catalyst layer 6 is made of a first noble metal or a combination of a second noble metal and a metal other than noble metals. Each of the first and second noble metals is, preferably, at least one metal selected from the group consisting of Au, Ag, Pt, Rh, Pd and Ru, and more preferably, at least one metal selected from the group consisting of Au, Ag, Pt and Rh. The metal other than noble metals is, for example, Ti.

The catalyst layer 6 may be made of a combination of at least one metal selected from the group consisting of Au, Ag, Pt and Rh, and at least one metal selected from the group consisting of Pd, Ru and Ti. For example, the catalyst layer 6 may be made of a combination of Au and at least one metal selected from the group consisting of Pd, Ru and Ti.

The catalyst layer 6 includes a first portion 4 and a second portion 5.

The first portion 4 and the second portion 5 are made of the above-described material. The material of the first portion 4 and the material of the second portion 5 may be the same or different from each other. According to an example, the first portion 4 is made of a combination of at least one metal selected from the group consisting of Au, Ag, Pt and Rh, and at least one metal selected from the group consisting of Pd, Ru and Ti, and the second portion 5 is made of at least one metal selected from the group consisting of Au, Ag, Pt and Rh.

The first portion 4 covers at least a part of the surface made of a semiconductor of the structure 1. The first portion 4 is, for example, a layer having an uneven structure on its surface. The first portion 4 may include discontinuous portions. The first portion 4 serves as a catalyst for the oxidation reaction of the surface made of a semiconductor that is in contact with the first portion 4.

The apparent density of the first portion 4 is higher than that of the second portion 5, and the thickness of the first portion 4 is smaller than that of the second portion 5. The thickness $d_1$ of the first portion 4 is preferably within a range of 1 nm to 1000 nm and more preferably within a range of 10 nm to 500 nm. When the first portion 4 is extremely thin, an excess amount of discontinuous portion may occur in the first portion 4. When the first portion 4 is thick, an etchant may not sufficiently be supplied to the surface made of a semiconductor.

The second portion 5 is located on the first portion 4. The second portion 5 includes, for example, a dendrite or flake made of a noble metal or a combination of a noble metal and a metal other than noble metals. Like the first portion 4, the second portion 5 serves as a catalyst for the oxidation reaction.

The apparent density of the second portion 5 is lower than that of the first portion 4, and the thickness of the second portion 5 is larger than that of the first portion 4. The thickness $d_2$ of the second portion 5 is preferably 0.1 μm or more and more preferably 1 μm or more. When the second portion 5 is thin, the second portion 5 may not be brought into contact with a portion, namely an unetched portion which was not etched by the first portion 4 because the first portion 4 does not act as a catalyst. The thicker the second portion 5, the higher the possibility that the unetched portion may be removed. The upper limit of the thickness of the second portion 5 is usually 5 μm or less though it is not particularly limited. The ratio of the thickness $d_1$ of the first portion 4 to the thickness $d_2$ of the second portion 5 ($d_1/d_2$) is preferably within a range of 0.01 to 10 and more preferably within a range of 0.01 to 0.5. The unetched portion will be described in detail later.

The apparent density will be described below. To describe the apparent density, the following region will be defined.

First, of the surface made of a semiconductor, a two-dimensional region corresponding to the sum of the first portion 4 and its discontinuous portions will be defined as an A region. Then, of the second portion 5, a part right above the A region will be defined as a B part. Of the three-dimensional region that is right above the A region, the part from the top surface of the first portion 4 to the level having the same height as the maximum height of the B part will be defined as a C part. The apparent density of the first portion 4 is a value obtained by dividing the mass of the first portion 4 by the volume of the sum of the first portion 4 and its discontinuous portion. The apparent density of the second portion 5 is a value obtained by dividing the mass of the B part by the volume of the C part. The apparent density can be confirmed by observing the section of the catalyst layer 6.

The foregoing catalyst layer 6 is obtained by, for example, the following method. Here, as an example, it is supposed that the catalyst layer 6 is made of a noble metal.

The catalyst layer 6 can be formed, for example, by electroplating, reduction plating or displacement plating. The first portion 4 can be formed by coating a dispersion containing noble metal particles, or vapor phase deposition such as evaporation and sputtering. As one example of forming the catalyst layer 6, the formation of the catalyst layer 6 by displacement plating will be described below.

For the deposition of a noble metal by displacement plating, it is possible to use an aqueous solution of potassium tetrachloroaurate (III), an aqueous solution of tetrachloroaurate (III), an aqueous solution of gold sulfite, an aqueous solution of potassium gold cyanide (I) solution, or the like. The following descriptions will be given assuming that the noble metal is gold.

The displacement plating solution is, for example, a mixture of an aqueous solution of potassium tetrachloroaurate (III) and hydrofluoric acid. The hydrofluoric acid has a function of removing a native oxide film from the surface of the structure 1.

The displacement plating solution may further include at least one of a complexing agent and a pH buffering agent. The complexing agent has a function of stabilizing noble metal ions included in the displacement plating solution. The pH buffering agent has a function of stabilizing the reaction rate of the plating. As these additives, for example, glycine, citric acid, carboxylate ions, cyanide ions, pyrophosphate ions, ethylenediaminetetraacetate, ammonia, aminocarboxylate ions, acetic acid, lactic acid, phosphate, boric acid, or a combination of two or more thereof can be used. Glycine and citric acid are preferable additives.

When the structure 1 is immersed in the displacement plating solution, a native oxide film is removed from the surface of the structure 1, and a noble metal, i.e. gold in this example, is deposited on a region of the surface of the structure 1 which is not covered with the mask layer 2. Consequently, the first portion 4 is obtained.

When displacement plating is performed under a specific condition, the catalyst layer 6 including the first portion 4 and the second portion 5 that includes a dendrite or flake can be obtained through a single process. The displacement plating solution used for the displacement plating includes, for example, an aqueous solution of potassium tetrachloroaurate (III), hydrofluoric acid, glycine, and citric acid.

The concentration of potassium tetrachloroaurate (III) in the displacement plating solution is preferably within a range of 10 μmol/L to 1000 mmol/L and more preferably within a range of 1 mmol/L to 100 mmol/L. When the concentration is low, a dendrite is less prone to be generated. When the concentration is high, the catalyst layer 6 is formed in high density and thus layers that differ in density and thickness may be difficult to form.

The concentration of hydrogen fluoride in the displacement plating solution is preferably within a range of 0.01 mol/L to 5 mol/L and more preferably within a range of 0.5 mol/L to 2 mol/L. When the concentration of hydrogen fluoride is low, a dendrite is less prone to be generated. When the concentration of hydrogen fluoride is high, the dissolution of the surface made of a semiconductor may progress and may cause an adverse effect on the following etching.

The concentration of glycine in the displacement plating solution is preferably within a range of 0.1 g/L to 20 g/L and more preferably within a range of 1 g/L to 10 g/L. When the concentration of glycine is low, a dendrite is less prone to be generated.

The concentration of citric acid in the displacement plating solution is preferably within a range of 0.1 g/L to 20 g/L and more preferably within a range of 1 g/L to 10 g/L. When the concentration of citric acid is low, a dendrite is less prone to be generated.

Instead of glycine and citric acid, additives having the same function as glycine and citric acid can be used. Instead of glycine, for example, carboxylate ions, cyanide ions, pyrophosphate ions, ethylenediaminetetraacetate, ammonia, or aminocarboxylate ions can be used. Instead of citric acid, for example, carboxylate ions, acetic acid, lactic acid, phosphate, or boric acid can be used.

When the structure 1 on which the mask layer 2 is formed is immersed in the displacement plating solution, thin fine layer made of gold is formed on a region of the surface made of a semiconductor that is not covered with the mask layer 2 and further a dendrite made of gold grows on the thin fine layer. Accordingly, the catalyst layer 6 including the second portion 5 that includes a dendrite can be obtained through a single process.

An etchant 7 is supplied to the catalyst layer 6 as shown in FIG. 3.

More specifically, for example, the structure 1 on which the mask layer 2 and the catalyst layer 6 are formed is immersed in the etchant 7. The etchant 7 includes hydrofluoric acid and an oxidizer.

Figure 4:
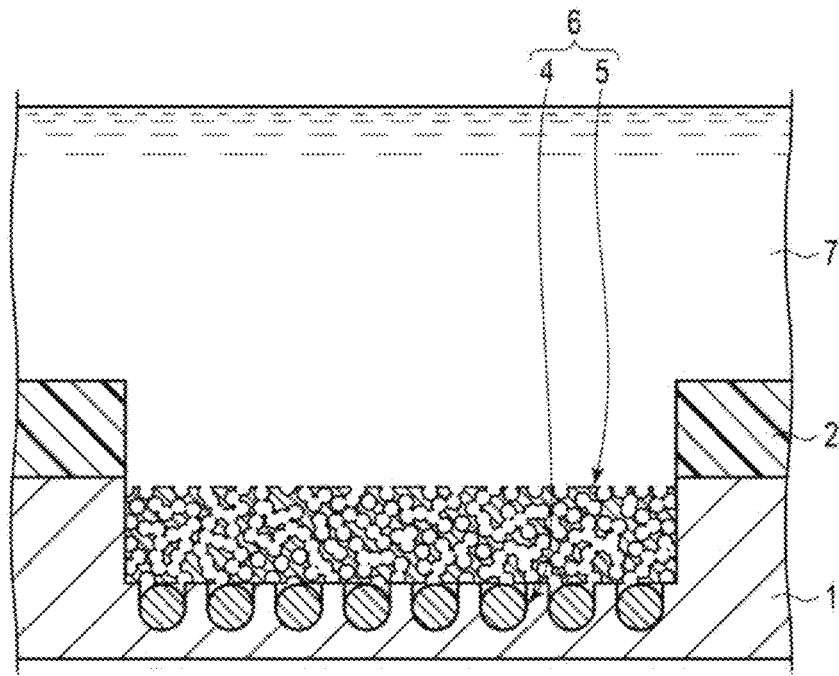
FIG. 4 is a sectional view schematically showing a state after a certain period of time from the state shown in FIG. 3.

When the etchant 7 is brought into contact with the surface made of a semiconductor, a portion of the surface to which the first portion 4 is in contact with is oxidized by the oxidizer and the oxide is dissolved away by the hydrofluoric acid. As shown in FIG. 4, therefore, the etchant 7 etches the surface made of a semiconductor in the vertical direction at the position of the opening with an assist from the catalyst layer 6 as a catalyst.

The concentration of hydrogen fluoride in the etchant 7 is preferably within a range of 1.0 mol/L to 20 mol/L, more preferably within a range of 5 mol/L to 10 mol/L, and most preferably within a range of 3 mol/L to 7 mol/L. When the concentration of hydrogen fluoride is low, it is difficult to achieve a high etching rate. When the concentration of hydrogen fluoride is high, excess side etching may occur.

The oxidizer in the etchant 7 can be selected from, for example, hydrogen peroxide, nitric acid, $AgNO_3$, $KAuCl_4$, $HAuCl_4$, $K_2PtCl_6$, $H_2PtCl_6$, Fe $(NO_3)_3$, Ni $(NO_3)_2$, Mg $(NO_3)_2$, $Na_2S_2O_8$, $K_2S_2O_8$, $KMnO_4$ and $K_2Cr_2O_7$. Hydrogen peroxide is favorable as the oxidizer because hydrogen peroxide does not form any harmful byproduct and does not contaminate a semiconductor element.

The concentration of the oxidizer such as hydrogen peroxide in the etchant 7 is preferably within a range of 0.2 mol/L to 8 mol/L, more preferably within a range of 2.0 mol/L to 4.0 mol/L, and most preferably within a range of 3.0 mol/L to 4.0 mol/L.

In the method shown in FIGS. 1 to 4, the surface made of a semiconductor of the structure 1 is etched as described above.

Figure 5:
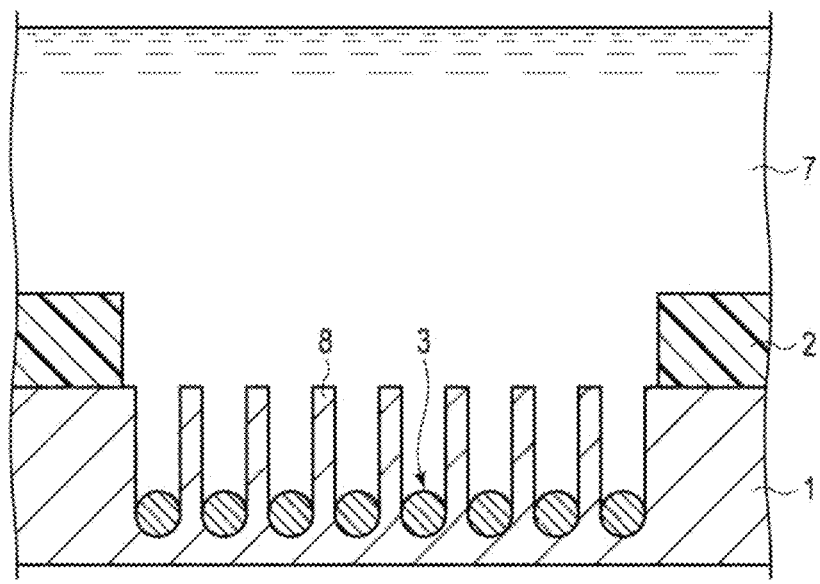
FIG. 5 is a sectional view schematically showing an etching step in a comparative example.

When the catalyst layer 6 is formed of the noble metal particles 3 in a form of aggregate having wide gaps among the particles, and the structure 1 including such catalyst layer 6 is immersed in the etchant 7 as shown in FIG. 5, the etchant 7 can easily reach the surface made of a semiconductor through the gaps among the noble metal particles 3. The etchant 7 thus etches a region of the surface made of a semiconductor which is in contact with the noble metal particles 3. However, of the surface made of a semiconductor, a region corresponding to the gaps among the noble metal particles 3 is difficult to be oxidized and thus etching is difficult to progress. Therefore, at the region corresponding to the gaps, needle-like residual portions 8a are generated. The needle-like residual portions 8a can be a cause of dust.

When gaps among the noble metal particles 3 are narrow, the etchant 7 cannot easily reach the surface made of a semiconductor. Thus, the etching hardly progresses.

The method described with reference to FIGS. 1 to 4 makes it difficult to generate the needle-like residual portions 8a while it allows etching to progress sufficiently. The present inventors consider the reason for this as follows.

Since the first portion 4 is thin as described above, it is very likely to include discontinuous portions. The etchant 7 can thus reach the surface made of a semiconductor through the discontinuous portions. Since the apparent density of the second portion 5 is lower than that of the first portion 4, the supply of the etchant 7 to the first portion 4 cannot be prevented. The semiconductor can thus be etched as shown in FIGS. 1 to 4.

The catalyst layer 6 moves downward as the etching progresses. However, since no etching progresses at the discontinuous portions and the catalyst layer 6 moves, an unetched portion remains at the position corresponding to the discontinuous portion. Since the second portion 5 is on the first portion 4 and thicker than the first portion 4, it is very likely for the second portion 5 to contact the unetched portion and oxidize it while the catalyst layer 6 is moving downward. The etchant 7 etches the oxidized unetched portion. It is thus considered that the needle-like residual portions are less prone to be generated.

Various modifications can be applied to the catalyst layer 6.

For example, the first portion 4 may be a particulate layer that is formed of metal particles made of a noble metal or a combination of a noble metal and a metal other than noble metal, such that the metal particles have gaps therebetween through which the etchant 7 can flow. Alternatively, the first portion 4 may be a porous film that is a continuous film made of a noble metal or a combination of a noble metal and a metal other than noble metal having a plurality of through holes therein.

The form of the second portion 5 can be different from a dendrite or flakes. For example, the second portion 5 may be a porous layer having liquid permeability.

The catalyst layer 6 may further include one or more portions in addition to the first portion 4 and the second portions 5. For example, the catalyst layer 6 may have a multilayer structure of three or more layers.

The second portion 5 needs not to be in a single body from the start of etching to the end thereof. That is to say, the second portion 5 may be decomposed into a plurality of pieces when the catalyst layer 6 moves downward as the etching progresses. These pieces may change their orientations as the catalyst layer 6 moves. Therefore, when the second portion 5 generates non-spherical pieces, e.g. when the second portion 5 including a dendrite is decomposed into a plurality of pieces, the possibility that the second portion 5 will contact the unetched portion becomes higher than when the second portion 5 remains as a single body.

The foregoing etching method can be used to manufacture a variety of articles. The etching method can also be used to form a recess or a through hole or to divide a structure such as semiconductor wafer. For example, the etching method can be used to manufacture a semiconductor device.

A method of manufacturing a semiconductor chip, including a method of etching a semiconductor wafer and singulating it into a plurality of semiconductor chips, will be described with reference to FIGS. 6 to 11.

Figure 6:
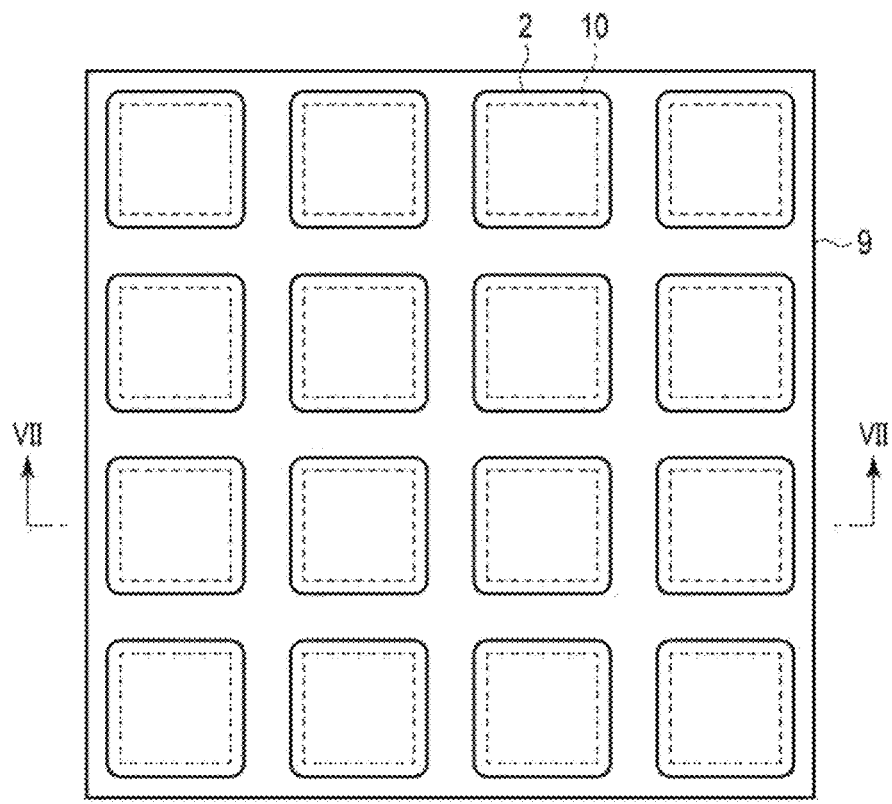
FIG. 6 is a plan view schematically showing a semiconductor wafer used in a method of manufacturing semiconductor chip according to an embodiment.
Figure 7:
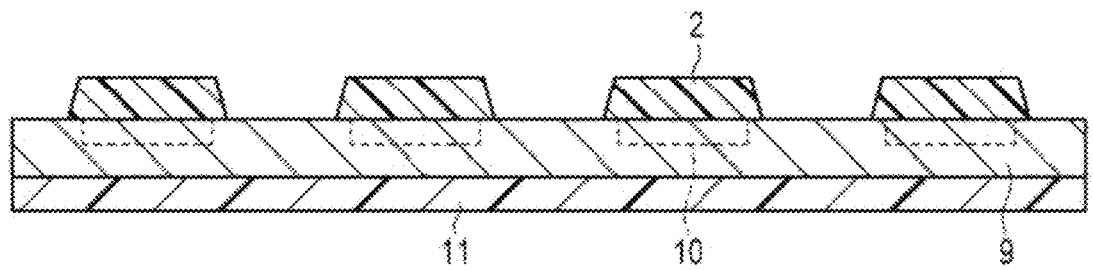
FIG. 7 is a sectional view taken along a line VII-VII of the semiconductor wafer shown in FIG. 6.

First, a structure shown in FIGS. 6 and 7 is prepared. This structure includes a semiconductor wafer 9, a mask layer 2 and a dicing sheet 11. Semiconductor element regions 10 are formed on the surface of the semiconductor wafer 9. The semiconductor element region 10 is a region in which semiconductor elements are formed. The mask layer 2 covers the semiconductor element region 10 and serves to protect the semiconductor elements against damage. The dicing sheet 11 is adhered to a surface of the semiconductor wafer 9, which is opposite to the surface on which the mask layer 2 is formed.

Figure 8:
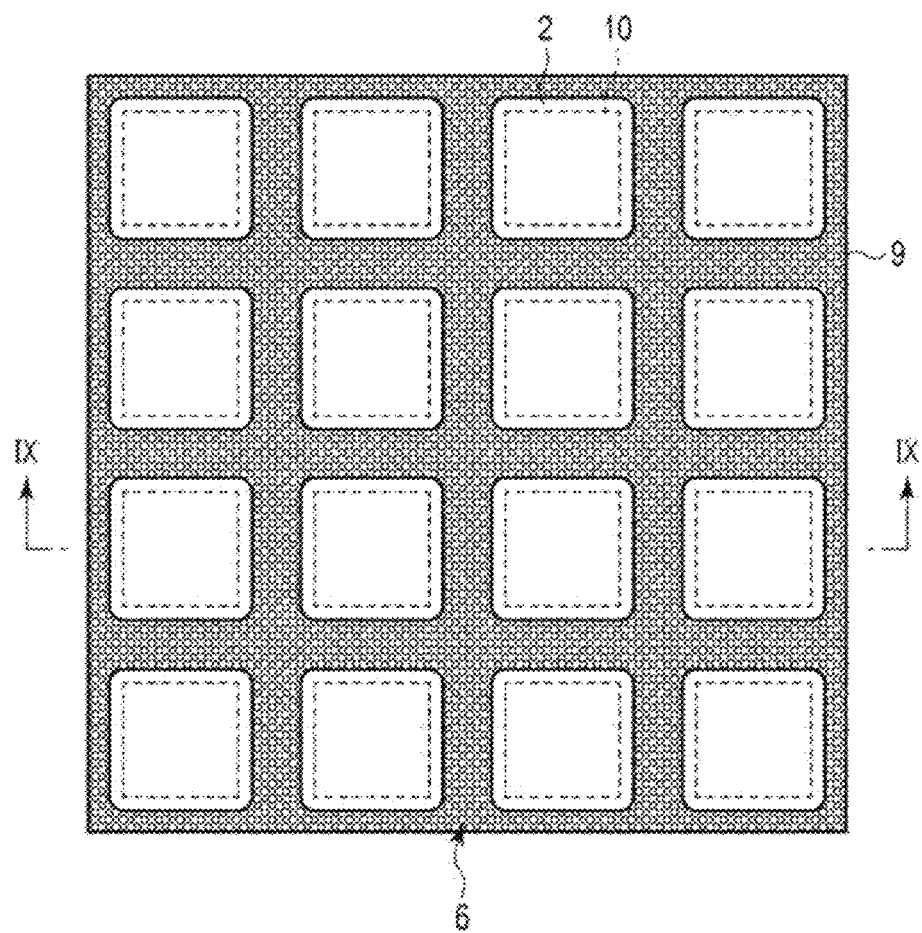
FIG. 8 is a plan view schematically showing a catalyst layer formation step in the method of manufacturing semiconductor chip according to the embodiment.
Figure 9:
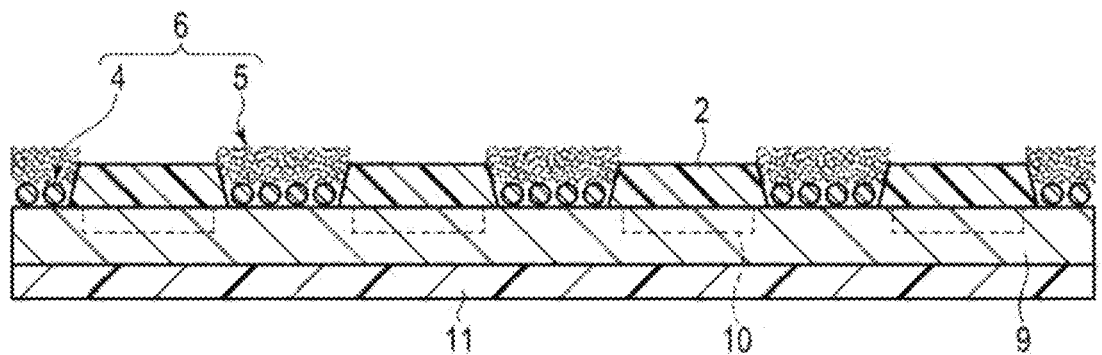
FIG. 9 is a sectional view taken along a line IX-IX of the semiconductor wafer shown in FIG. 8.

Then, as shown in FIGS. 8 and 9, a catalyst layer 6 that is made of a first noble metal or a combination of a second noble metal and a metal other than noble metals is formed on the surface of the semiconductor wafer 9 by the method described with reference to FIG. 2.

Then, the structure shown in FIGS. 8 and 9 is etched by the method described with reference to FIGS. 1-4. The etching is performed until the bottom surface of a recess generated by the etching reaches the surface of the dicing sheet 11.

Figure 10:
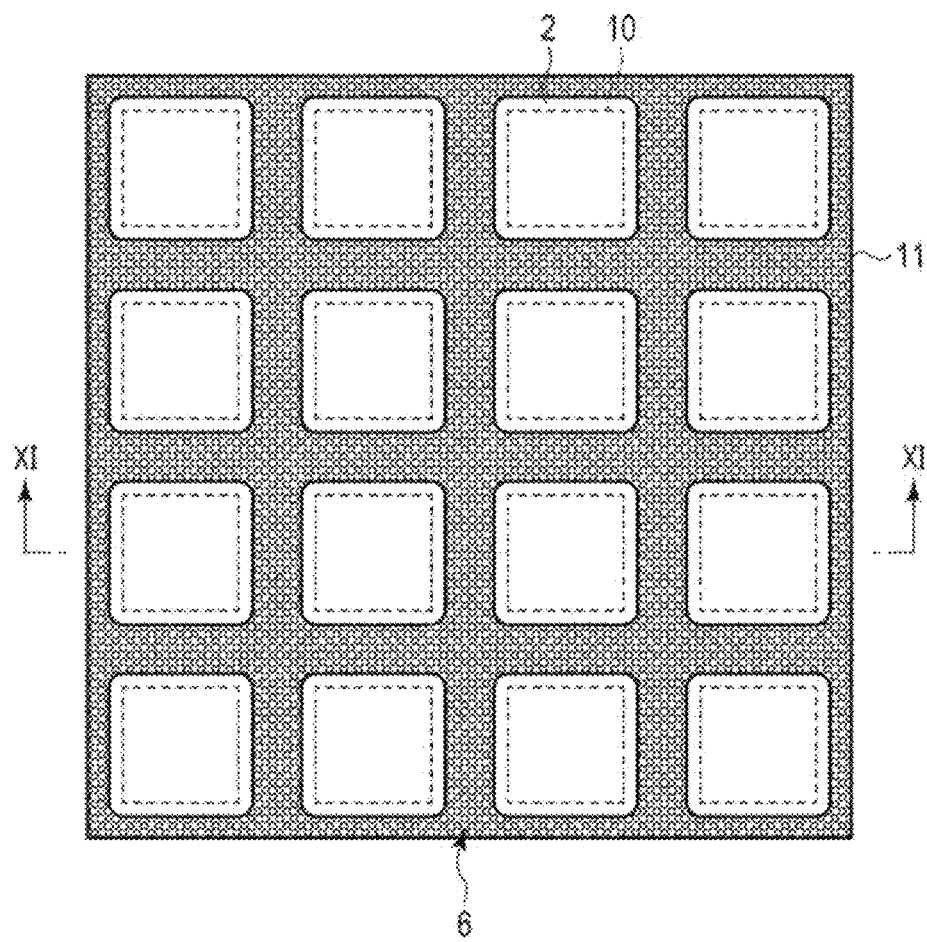
FIG. 10 is a plan view schematically showing an example of a structure obtained by the method shown in FIGS. 6 to 9.

As described above, the foregoing method makes it possible to obtain semiconductor chips 12 each including a semiconductor element region 10 as shown in FIGS. 10 and 11.

In this method, the mask layer 2 can be used as, e.g., a protective layer for protecting the semiconductor chips. The mask layer 2 covers the entire surface of the semiconductor chips. Therefore, this method can thus achieve a higher strength as compared with the case where general dicing using a blade is performed.

Also, in this method, the shape of the upper surface of each semiconductor chip is not limited to a square or rectangle. For example, the upper surface shape of each semiconductor chip may also be a circle or hexagon. Furthermore, this method makes it possible to simultaneously form semiconductor chips having different upper surface shapes.

Test examples will be described below.

(Test 1)

A mask layer and a catalyst layer including first and second portions were formed on a structure, and this structure was etched by the following method. The influence of the form of the catalyst layer upon the etching was investigated.

First, a mask layer was formed on the surface of a structure that is made of a semiconductor. The mask layer was formed by photolithography using a photoresist. The width of an opening of the mask layer was 5 µm.

Then, a plating solution A was prepared by mixing an aqueous solution of potassium tetrachloroaurate (III), hydrofluoric acid, glycine, and citric acid. In the plating solution A, the concentration of potassium tetrachloroaurate (III) was 5 mmol/L, that of hydrogen fluoride was 1 mol/L, that of glycine was 10 g/L, and that of citric acid was 10 g/L.

Figure 13:
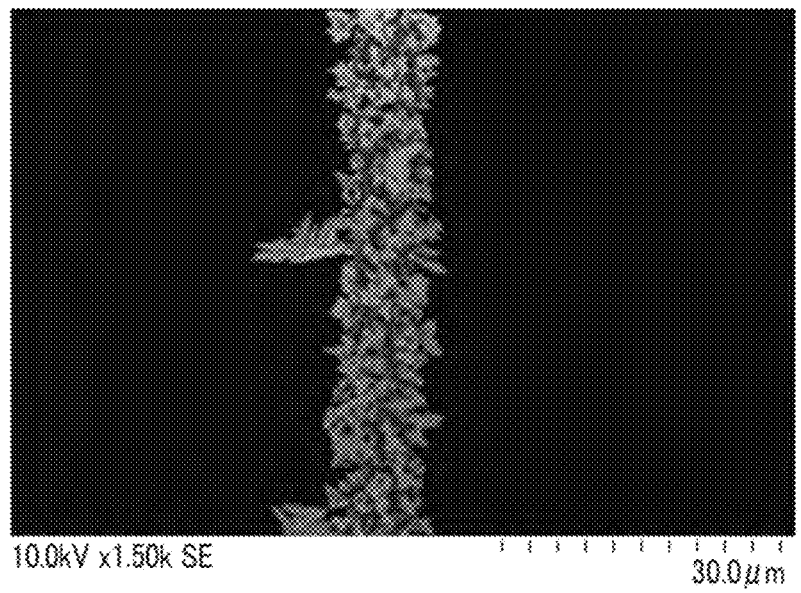
FIG. 13 is a micrograph showing a top surface of the structure on which a dendrite is formed.

Then, the structure on which the mask layer was formed was immersed in the plating solution A at 23° C. for three minutes to form a catalyst layer. FIGS. 12 and 13 show results obtained by observing the structure on which the catalyst and mask layers were formed, with a scanning electron microscope.

FIG. 12 is a scanning electron micrograph showing a section of a catalyst layer formed by using the plating solution A. FIG. 13 is a scanning electron micrograph showing a top surface of the catalyst layer formed by using the plating solution A. It was confirmed that as shown in FIGS. 12 and 13, the catalyst layer includes first and second portions, the second portion was a dendrite, the second portion was thicker than the first portion, and the apparent density of the second portion was lower than that of the first portion.

Then, an etchant was prepared by mixing hydrofluoric acid and hydrogen peroxide. In this etchant, the concentration of hydrogen fluoride was 10 mol/L and that of hydrogen peroxide was 0.5 mol/L.

Figure 14:
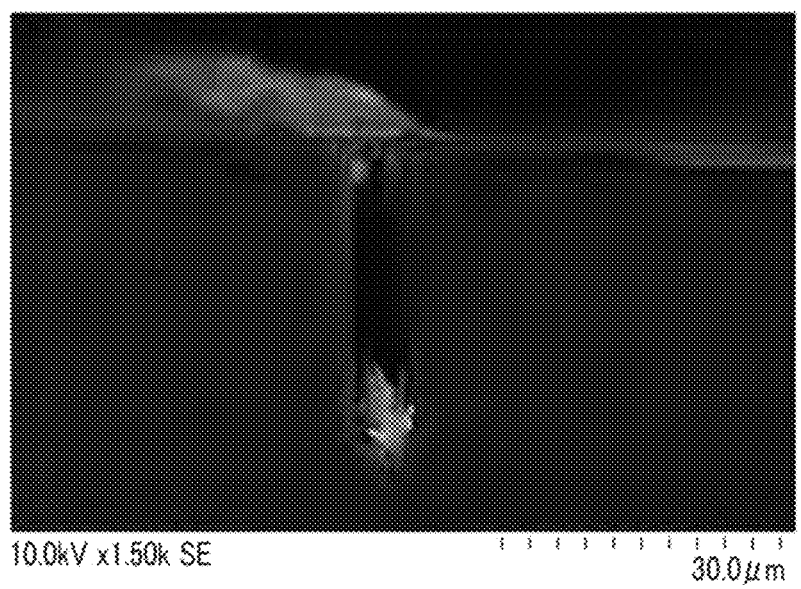
FIG. 14 is a micrograph showing a section of a structure obtained by etching the structure on which a dendrite is formed.

The structure on which the mask and catalyst layers were formed was immersed in the etchant and etched. FIG. 14 shows a result obtained by observing the etched structure with the scanning electron microscope.

FIG. 14 is a scanning electron micrograph showing a section of the etched structure. As shown in FIG. 14, a needle-like residual portion was prevented from being generated.

(Test 2)

By the same method as described in Test 1 except that the width of the opening was 10 μm, a mask layer and a catalyst layer were formed on a structure, and this structure was etched FIG. 15 is a scanning electron micrograph showing a section of a catalyst layer formed by using the plating solution A. FIG. 16 is a scanning electron micrograph showing a top surface of the catalyst layer formed by using the plating solution A. It was confirmed that as shown in FIGS. 15 and 16, the catalyst layer includes first and second portions, the second portion was a dendrite, the second portion was thicker than the first portion, and the apparent density of the second portion was lower than that of the first portion.

Figure 17:
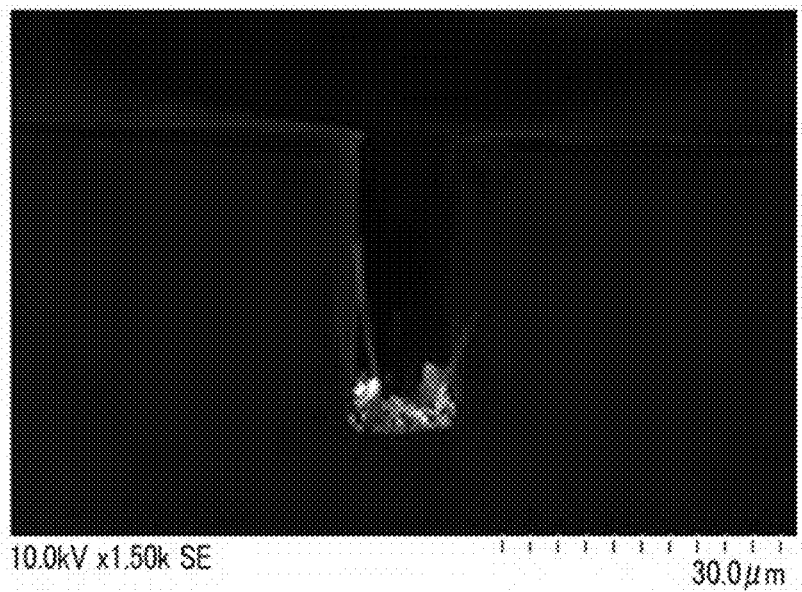
FIG. 17 is a micrograph showing a section of a structure obtained by etching the structure on which a dendrite is formed.

FIG. 17 is a scanning electron micrograph showing a section of the etched structure. As shown in FIG. 17, a needle-like residual portion was prevented from being generated.

(Test 3)

A mask layer and a catalyst layer formed of noble metal particles in a form of aggregate was formed on a structure, and this structure was etched by the following method. The influence of the form of the catalyst layer upon the etching was investigated.

First, a mask layer was formed on the surface of a structure that is made of a semiconductor by the same method as in Test 1. The width of an opening of the mask layer was 10 μm.

Then, a plating solution B was prepared by mixing an aqueous solution of potassium tetrachloroaurate (III), hydrofluoric acid, ammonium hydrogen fluoride, glycine, and citric acid. In the plating solution B, the concentration of potassium tetrachloroaurate (III) was 1 mmol/L, that of hydrogen fluoride was 0.25 mol/L, that of ammonium fluoride was 4.75 mol/L, that of glycine was 1 g/L, and that of citric acid was 10 g/L.

Figure 18:
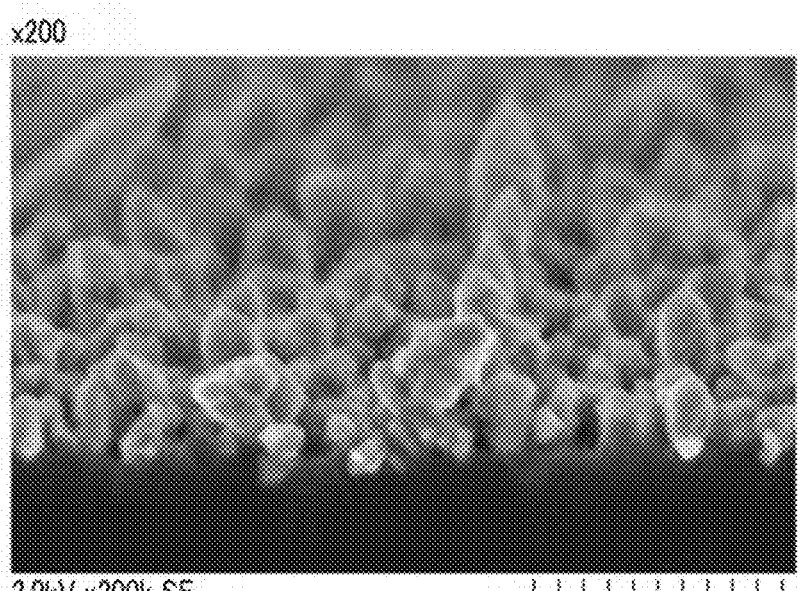
FIG. 18 is a micrograph showing a section of a structure on which a catalyst layer formed of noble metal particles is formed.

Then, the structure was immersed in the plating solution B at room temperature for one minute to form a catalyst layer. FIG. 18 shows results obtained by observing the structure on which the catalyst and mask layers were formed, with a scanning electron microscope.

FIG. 18 is a scanning electron micrograph showing a section of a catalyst layer formed by using the plating solution B. It was confirmed that the catalyst layer was formed of noble metal particles in a form of aggregate as shown in FIG. 18.

Figure 19:
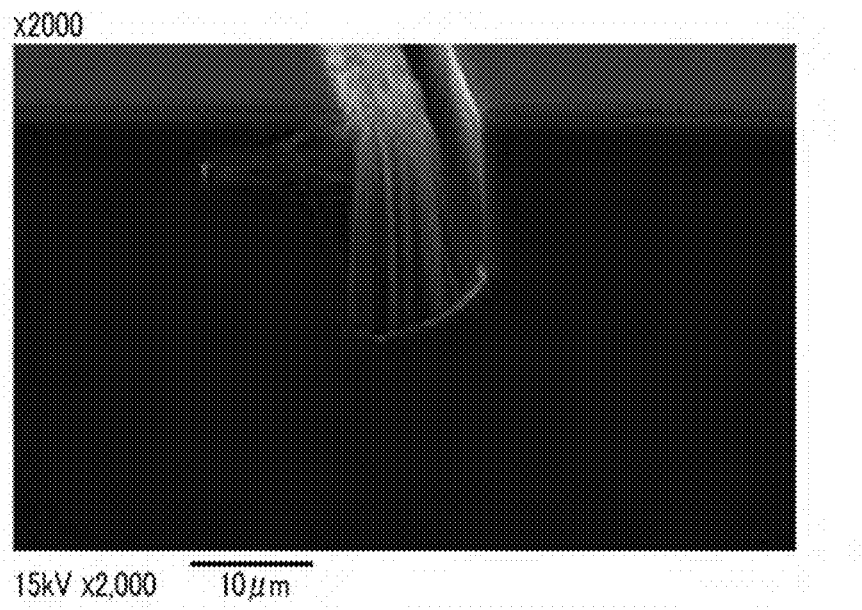
FIG. 19 is a micrograph showing a section of a structure obtained by etching the structure on which a catalyst layer formed of noble metal particles is formed.

Then, as in Test 1, an etchant was prepared to etch the structure. FIG. 19 shows a result obtained by observing the etched structure with the scanning electron microscope. FIG. 19 is a scanning electron micrograph showing a section of the etched structure. As shown in FIG. 19, needle-like residual portions were generated.

(Test 4)

By the same method as described in Test 3 except that the structure was immersed in the plating solution B for three minutes, a mask layer and a catalyst layer were formed on a structure, and this structure was etched.

Figure 20:
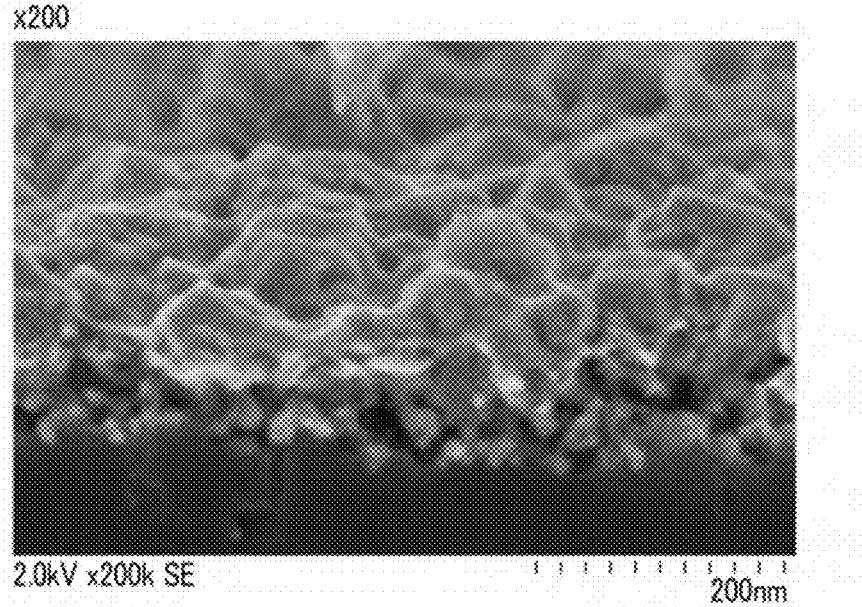
FIG. 20 is a micrograph showing a section of a structure on which a catalyst layer formed of noble metal particles is formed.

FIG. 20 is a scanning electron micrograph showing a section of the structure of a catalyst layer formed by using the plating solution B. It was confirmed that the catalyst layer was formed of noble metal particles in a form of aggregate as shown in FIG. 20.

FIG. 21 is a scanning electron micrograph showing a section of the etched structure. As shown in FIG. 21, no etching progressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An etching method comprising:
   forming a catalyst layer made of a first noble metal or a combination of a second noble metal and a metal other than noble metals on a surface made of a semiconductor, the catalyst layer including a first portion and a second portion, the first portion covering at least a part of the surface, the second portion being located on the first portion, having an apparent density lower than that of the first portion, and being thicker than the first portion; and
   supplying an etchant to the catalyst layer to cause an etching of the surface with an assist from the catalyst layer as a catalyst.

2. The etching method according to claim 1, wherein each of the first and second noble metals is at least one metal selected from the group consisting of Au, Ag, Pt and Rh.

3. The etching method according to claim 1, wherein the semiconductor includes Si.

4. The etching method according to claim 1, wherein the etchant includes $H_2O_2$.

5. The etching method according to claim 1, further comprising forming on the surface a mask layer having an opening with a width in a range of 0.1 μm to 15 μm, and the etching is performed at a position of the opening.

6. The etching method according to claim 1, wherein the second portion includes a dendrite or flake made of the first noble metal or the combination of the second noble metal and the metal other than noble metals.

7. A method of manufacturing a semiconductor chip, comprising etching a semiconductor wafer by the etching method according to claim 1 to singulate the semiconductor wafer into semiconductor chips, the surface being a surface of the semiconductor wafer.

8. The method according to claim 7, wherein each of the first and second noble metals is at least one metal selected from the group consisting of Au, Ag, Pt and Rh.

9. The method according to claim 7, wherein the semiconductor includes Si.

10. The method according to claim 7, wherein the etchant includes $H_2O_2$.

11. The method according to claim 7, further comprising forming on the surface a mask layer having an opening with a width in a range of 0.1 μm to 15 μm, and the etching is performed at a position of the opening.

12. The method according to claim 7, wherein the second portion includes a dendrite or flake made of the first noble metal or the combination of the second noble metal and the metal other than noble metals.

13. A method of manufacturing an article, comprising etching the surface by the etching method according to claim 1.

14. The method according to claim 13, wherein each of the first and second noble metals is at least one metal selected from the group consisting of Au, Ag, Pt and Rh.

15. The method according to claim 13, wherein the semiconductor includes Si.

16. The method according to claim 13, wherein the etchant includes $H_2O_2$.

17. The method according to claim 13, further comprising forming on the surface a mask layer having an opening with a width in a range of 0.1 μm to 15 μm, and the etching is performed at a position of the opening.

18. The method according to claim 13, wherein the second portion includes a dendrite or flake made of the first noble metal or the combination of the second noble metal and the metal other than noble metals.

* * * * *